US012592715B2

(12) United States Patent
Schaffenrath et al.

(10) Patent No.: US 12,592,715 B2
(45) Date of Patent: Mar. 31, 2026

(54) POST-SAMPLING SELECTABLE GAIN IN SAMPLE AND HOLD ANALOG-TO-DIGITAL CONVERTERS

(71) Applicant: Cypress Semiconductor Corporation, San Jose, CA (US)

(72) Inventors: David Schaffenrath, Villach (DE); Rocco Calabro, Arnoldstein (DE); Ketan Dewan, Fremont, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 108 days.

(21) Appl. No.: 18/435,523

(22) Filed: Feb. 7, 2024

(65) Prior Publication Data

US 2025/0253860 A1 Aug. 7, 2025

(51) Int. Cl.
*H03M 1/46* (2006.01)
*H03M 1/12* (2006.01)

(52) U.S. Cl.
CPC ............. *H03M 1/46* (2013.01); *H03M 1/129* (2013.01)

(58) Field of Classification Search
CPC ................................ H03M 1/46; H03M 1/129
USPC ......................... 341/118, 120, 144, 155, 122
See application file for complete search history.

(56) References Cited

U.S. PATENT DOCUMENTS

| | | | | |
|---|---|---|---|---|
| 10,564,491 B2 * | 2/2020 | Nakanishi | ......... | G02F 1/136286 |
| 2014/0375224 A1 * | 12/2014 | Jung | ...................... | H05B 45/10 |
| | | | | 315/297 |
| 2021/0295775 A1 * | 9/2021 | Lin | ...................... | G09G 3/3258 |
| 2022/0317164 A1 * | 10/2022 | Zou | ........................ | G01R 19/25 |

* cited by examiner

*Primary Examiner* — Peguy Jean Pierre

(57) ABSTRACT

A system and method for a post-sampling selectable gain circuit in sample and hold (S/H) analog-to-digital converters (ADCs). The method includes scaling down or scaling up a reference voltage to generate a plurality of candidate voltages associated with a plurality of measurement accuracies of a sampler circuit, each candidate voltage of the plurality of candidate voltages is respectively associated with a respective measurement accuracy of the plurality of measurement accuracies. The method includes selecting, by a processing device and based on an input voltage for the sampler circuit, a particular candidate voltage from the plurality of candidate voltages that is associated with an optimal measurement accuracy of the plurality of measurement accuracies. The method includes generating a sampler voltage associated with the optimal measurement accuracy by operating the sampler circuit based on the particular candidate voltage or an additional voltage associated with the particular candidate voltage.

19 Claims, 4 Drawing Sheets

POST-SAMPLING SELECTABLE GAIN IN SAMPLE AND HOLD ANALOG-TO-DIGITAL CONVERTERS

TECHNICAL FIELD

The present disclosure relates generally to the field of electronics, and more particularly, to a post-sampling selectable gain circuit in sample and hold (S/H) analog-to-digital converters (ADCs).

BACKGROUND

An analog-to-digital converter is a system that converts a continuous-time and continuous-amplitude analog signal into a discrete-time and discrete-amplitude digital signal. Instead of continuously performing the conversion, an ADC does the conversion periodically, sampling the input, and limiting the allowable bandwidth of the input signal. An ADC may also provide an isolated measurement such as an electronic device that converts an analog input voltage or current to a digital number representing the magnitude of the voltage or current. The digital output may be a two's complement binary number that is proportional to the analog input, but there are several other possibilities.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
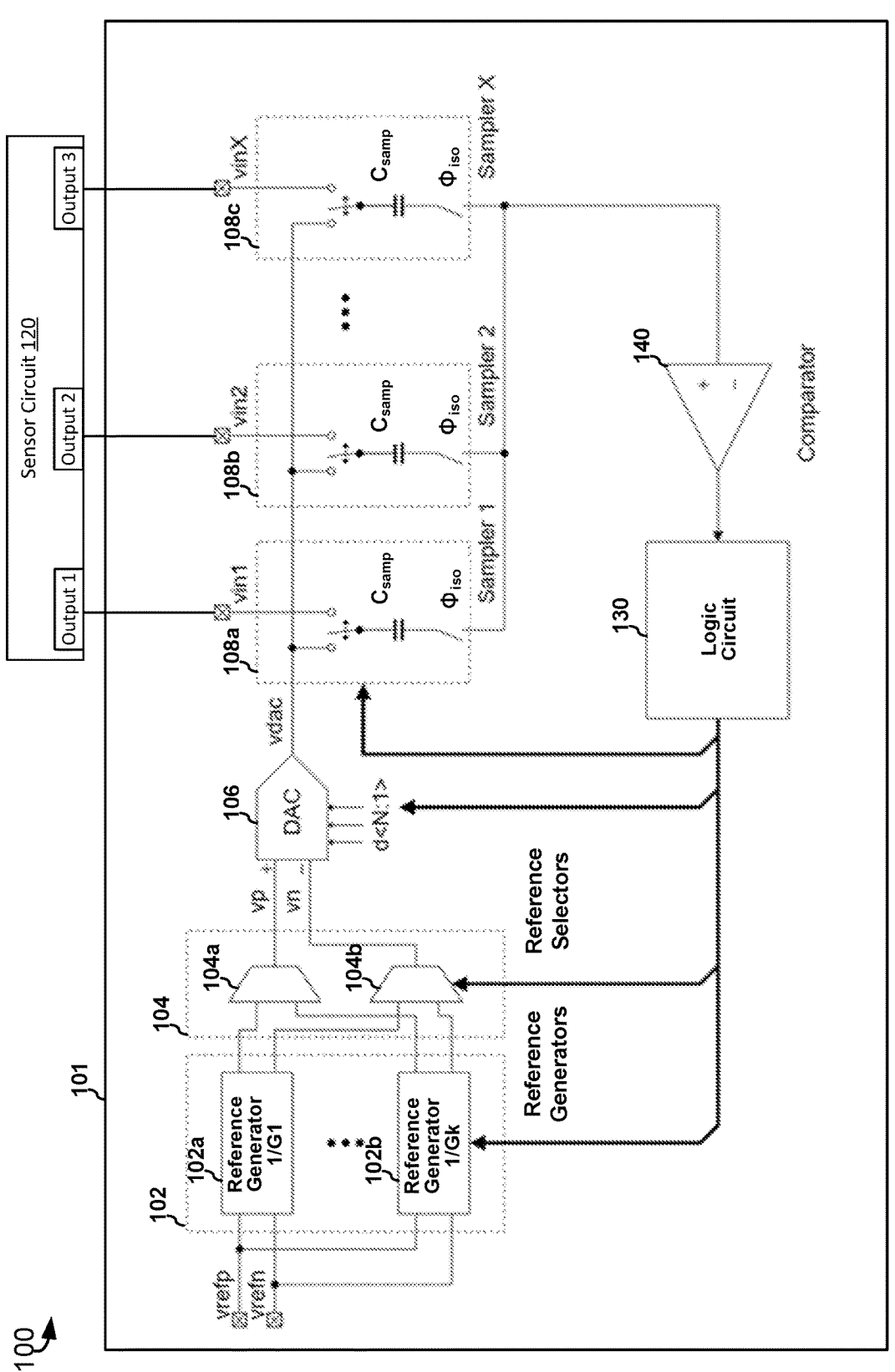
FIG. 1 illustrates a block diagram of an example environment for using post-sampling selectable gain (PSSG) circuit in S/H ADCs, according to some embodiments.

The following description sets forth numerous specific details such as examples of specific systems, components, methods, and so forth, in order to provide a good understanding of various embodiments of the techniques described herein for improving the measurement accuracy of S/H ADCs, for example, by using a post-sampling selectable gain circuit. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

The accuracy of an ADC to convert an analog input signal to a digital output signal depends, in at least some respects, on the amplitude of the analog input signal—i.e., as the amplitude is reduced, so is the ability for the ADC to accurately perform the conversion. One conventional technique of improving the ADC's accuracy in converting the analog input signal to a digital output signal is to amplify the analog input signal before it is measured by the ADC, so to fully utilize the input voltage range of the ADC. The signal amplification is done via a dedicated operational amplifier (OpAmp) or programmable gain amplifier (PGA). The output of that amplifier then gets sampled at the Sample & Hold stage (S&H) of the ADC, which subsequently, after the end-of-sampling (EOS), performs the conversion of the sampled voltage.

However, the usage of an amplifier in this conventional configuration comes with several restrictions. First, if the ADC is sampling multiple signals simultaneously, then each of these signals requires its own dedicated amplifier. Depending on whether the amplifiers are on-chip or off-chip, they either consume silicon area, or PCB area and component costs Second, in systems with low-latency EOS-trigger requirements, the amplifier must always be enabled such that the EOS can take place timely after the respective trigger is received. Third, the amplification happens during the sample-time of the ADC, thus the amplification setting is frozen after EOS. Fourth, when adjusting the gain of the amplifier the output requires a certain time to settle to the new value. In this timeframe no meaningful EOS event can take place. Fifth, in case of an amplifier shared among multiple ADC channels (e.g., multiplexed input to the amplifier), changing the gain of the amplifier between channels can limit the conversion speed. Sixth, the amplifier limits the bandwidth of the signal, whereas the ADC S&H stage would have a higher bandwidth limit. Seventh, each amplifier will have its own gain error, which in turn means that every amplifier must be calibrated if good gain-error performance is desired.

An alternative conventional technique to the amplification of the small-amplitude input signals, is to scale-down the minimal voltage step (e.g., the Least Significant Bit (LSB) step size), which the ADC operates with, by implementing an attenuation via capacitor scaling. In such a design, the sampling capacitor is bigger than the capacitive Digital-to-Analog Converter (C-DAC) which is used for the conversion, effectively giving the sampling signal more weight than the C-DAC output.

However, scaling-down the minimal voltage step also comes with several restrictions. First, if the ADC is sampling multiple signals simultaneously, then each of these signals requires its own sampling capacitor. These sampling capacitors consume a non-negligible amount of silicon area since they must have capacitance values which are multiple times higher than the capacitance of the C-DAC. Second, the amplification happens during the sample-time of the ADC, thus the amplification setting is frozen after EOS. Third, the amplification setting to use is, due to implementation complexity, limited to a couple of pre-defined settings. Fourth, the big sampling capacitance requires longer sample times, which limits the maximum single-channel conversion throughput. Furthermore, each gain setting requires a separate sample capacitance and thus a separate sample-time, which means that not all gain settings are equal/transparent for the end-customer. Fifth, the implementation demands at least a partial discharge of the sample capacitor during the conversion process, hence a lot of charge must be provided from the sensor at the start of sample after a conversion. Sixth, the attenuated C-DAC LSB size also makes comparator decisions harder, which in turn requires relaxed comparator decision times and limits the speed of the ADC. Seventh, the architecture demands the sample capacitor and C-DAC to be separate entities. This leads, in combination with the discharge of the sample-capacitor during the conversion phase, to dielectric relaxation issues. This effect must then be dealt with by e.g. relaxing or foot-noting spec limits, introducing dedicated calibration mechanisms, etc. Lastly, since sample-capacitor and C-DAC are separate entities, a mismatch of the capacitor ratios from the designed—for value leads to gain errors. This gain error must then be corrected for every sample-capacitor/C-DAC combination in use.

Aspects of the disclosure address the above-noted and other deficiencies by disclosing a post-sampling selectable gain (PSSG) circuit for improving the measurement accuracy of S/H ADCs.

In an illustrative embodiment, an output of a plurality of reference generators are coupled to a first set of inputs of a reference selector, whose output is coupled to a sampler circuit. The plurality of reference generators are configured to receive a reference voltage and scale down or scale up the reference voltage to generate a plurality of candidate voltages associated with a plurality of measurement accuracies of a sampler circuit. Each candidate voltage of the plurality of candidate voltages is respectively associated with a respective measurement accuracy of the plurality of measurement accuracies. A logic circuit (e.g., one or more processors) are coupled to a second set of inputs of the reference selector. The logic circuit is configured to select, using the reference selector and based on an input voltage for the sampler circuit, a particular candidate voltage from the plurality of candidate voltages that is associated with an optimal measurement accuracy of the plurality of measurement accuracies. The sampler circuit is configured to generate a sampler voltage associated with the optimal measurement accuracy by operating the sampler circuit based on the particular candidate voltage or an additional voltage associated with the particular candidate voltage. For example, a DAC may generator an analog voltage (e.g., an additional voltage) based on the particular candidate voltage.

There are several benefits of the embodiments of the present disclosure over the conventional architecture with per-sampler gain-amplifiers. First, the present embodiments occupy less area to implement as compared to the conventional system in which an amplifier is used on every channel. Whereas each sampler with a gain setting would need its own dedicated amplifier, in case the channels must be sampled simultaneously, the reference generators can be shared among channels.

Second, the bandwidth of the input signal of the present embodiments is not limited by any amplifiers; thereby allowing shorter sample times, especially in the case of multiplexed input voltages.

Third, instead of a having one gain error per amplifier, only a single gain error per reference generator exists. This is beneficial for pseudo-differential operations in which two single-ended sampler are sampled simultaneously, but converted by two distinct conversion sequences whose results are then subtracted. Gain errors on these pseudo-differential conversions are common and are thus reduced or even canceled out.

Fourth, the gain setting is flexible instead of being fixed, even after the end of sampling, and can be changed almost instantly. And, a change in gain setting doesn't require any special handling by the application software, such as an initial prolonged sample time after the change.

Fifth, the present embodiments have an input voltage robustness against mis-configuration and voltage overshoots/undershoots. That is, a voltage outside the range of reference voltage per gain (Vrefp/gain) will not impact the performance of the circuit (e.g. no saturation of amplifiers which then would need a longer sample time to recover).

Lastly, the present embodiments also use less power consumption than the conventional solution.

There are also several benefits of the embodiments of the present disclosure over the conventional architecture with a gain setting implemented via capacitive attenuation. First, the area is reduced because the C-net for the samplers can be sized as low as possible to reach matching and noise (kTC) requirements. In particular, the sampler capacitance does not need to be bigger than the DAC (e.g., Csamp~G*Cdac in the case of the capacitive attenuation concept).

Second, the present embodiments have a flexible gain setting (as opposed to being fixed), even after the end of sampling, and can be changed instantly. A change in gain setting does not demand any special handling by the application software (e.g., such as an initial prolonged sample time after the change).

Third, the smaller sampling capacitor allows for shorter sample times. Furthermore, it allows implementations in which the capacitors are not discharged, such that only the delta-voltage between the previous and the current sample needs to be settled, something that is conceptually not possible with the capacitive attenuation of the conventional solution. Also, it means that the minimum possible sample time is independent of the gain-setting, since the used sampling capacitor does not scale with the gain setting.

Fourth, the present embodiments use a reduced input charge consumption. Since the sampler does not get discharged during conversion, only the delta-charge to the previous sample should be provided by the sensor.

Fifth, there is a minimized impact of dielectric relaxation effects. The sampler and conversion C-net can be one and the same and the sampling capacitor is not getting discharged during the conversion. Hence the voltage that is "imprinted" on the capacitor (e.g., memory effect) is always similar which means that relaxation to old voltage values introduces minimal errors.

Sixth, the gain errors are reduced. That is, instead of having one gain error per sampler (e.g. due to mismatch between sampler and conversion C-net), only a single gain error per reference exists. As mentioned above, this is good for pseudo-differential operations.

Lastly, the present embodiments have higher conversion speed. That is, the effective Least Significant Bit (LSB) voltage difference on the comparator nodes is maximized, which means higher possible comparator and thus conversion speed because comparator decision time is inversely proportional to the resolved voltage difference on its inputs.

FIG. 1 illustrates a block diagram of an example environment for using post-sampling selectable gain (PSSG) circuit in S/H ADCs, according to some embodiments. The environment 100 includes a PSSG circuit 101 and a sensor circuit 120. The PSSG circuit 101 includes one or more reference generators 102 (e.g., reference generator 102a and reference generator 102b). The PSSG circuit 101 includes reference selectors 104 (e.g., reference selectors 104a, reference selectors 104b). The PSSG circuit 101 includes a DAC 106, a logic circuit 130 (e.g., one or more processors) and a comparator 140. The PSSG circuit 101 includes one or more samplers circuit 108. For example, the PSSG circuit 101 includes a sampler circuit 108a ("Sampler 1"), a sampler circuit 108b ("Sampler 2"), up to a sampler circuit 108c ("Sampler X").

The outputs of the reference generators 102 are coupled to a first set of inputs of the reference selectors 104, whose outputs are coupled to a first set of inputs of the DAC 106. The outputs of the DAC 106 are coupled to a first set of inputs of each of the sampler circuits 108, whose outputs are coupled to an input of the comparator 140. A first set of outputs of the logic circuit 130 is coupled to a second set of inputs of the reference generators 102; a second set of outputs of the logic circuit 130 is coupled to a second set of inputs (sometimes referred to as selection inputs) of the reference selectors 104; and a third set of outputs of the logic circuit 130 is coupled to a second set of inputs of the sampler circuits 108.

A dedicated output of the sensor circuit 120 is coupled to an input of each sampler circuit. For example, output 1 (Vin1) of the sensor circuit 120 is coupled to a third input of the sampler circuit 108a; output 2 (Vin2) of the sensor circuit 120 is coupled to a third input of the sampler circuit 108b; and output 3 (VinX) of the sensor circuit 120 is coupled to a third input of the sampler circuit 108c. The sensor circuit 120 may drive output 1, output 2, and output 3 with the same voltage. For example, the sensor circuit 120 may drive output 1, output 2, and output 3 with a direct current (DC) voltage (e.g., 1V). The sensor circuit 120 may drive output 1, output 2, and output 3 with different voltages. For example, the sensor circuit 120 may drive output 1 with 1V, output 2 with 2V, or output 3 with 3V. In some embodiments, the sensor circuit 120 may be provided by a third party (e.g., customer).

The reference generators 102 are each configured to have a particular gain level or setting. For example, the reference generator 102a is configured to have a particular gain level (e.g., 1) and reference generator 102b is configured to have a different gain level (e.g., 2).

The reference generators 102 are configured to receive an input voltage range (referred to a reference voltage) that is from a negative reference (vrefn) to a positive reference (vrefp). The reference generators 102 are configured to scale down the reference voltage to generate, based on the different gain levels/settings, a plurality of candidate voltages associated with a plurality of measurement accuracies of the sampler circuit 108a; where each candidate voltage is respectively associated with a respective measurement accuracy of the plurality of measurement accuracies.

For example, if a first candidate voltage that was produced from reference generator 102a, or a voltage that is derived (e.g., by a DAC) from the candidate voltage, is provided to the first set of inputs of the sampler circuit 108a, then the sampler circuit 108a may generate, based on the first candidate voltage and Vin1, an output voltage having a first measurement accuracy. Alternatively, if the second candidate voltage that was produced from reference generator 102b, or a voltage that is derived (e.g., by one or more DACs) from the candidate voltage, is provided to the first set of inputs of the sampler circuit 108a, then the sampler circuit 108a may generate, based on the second candidate voltage and Vin1, an output voltage having a second measurement accuracy.

The logic circuit 130 is configured to select, from among the plurality of candidate voltages and based on the input voltage (e.g., Vin) for the sampler circuit 108a, the particular candidate voltage that will cause the sampler circuit 108 to produce an output having the highest measurement accuracy. For example, the logic circuit 130 compares the plurality of candidate voltages to the input voltage (e.g., Vin) to generate a plurality of difference voltages. The logic circuit 130 may identify the particular difference voltage that is less than all other difference voltages of the plurality of difference voltages. The logic circuit 130 may then determine that the particular difference voltage corresponds to a particular candidate voltage. In response, the logic circuit 130 may then send an output signal to the selection inputs of the reference selectors 104 to cause the reference selectors 104 to select the particular candidate voltage and allow the particular voltage to pass to the first inputs of the DAC 106.

In some embodiments, the designer of the PSSG circuit 101 already knows that the PSSG circuit 101 will be coupled to a particular sensor circuit 120 that provides a particular input voltage. Therefore, the designer may pre-configure the PSSG circuit 101 to optimally operate using this particular input voltage by pre-selecting the appropriate gain setting based on the input voltage to let the reference voltage match the voltage range. Therefore, in this embodiment, there is no need for the PSSG circuit 101 to select the appropriate gain setting because the designer has already pre-selected the appropriate gain setting to cause the ADCs to operate with optimal measurement accuracy for its intended application.

The DAC 106 is configured to generate, based on the particular candidate voltage and the voltage input from the logic circuit 130, an analog voltage (e.g., Vdac). The DAC 106 provides the analog voltage to each of the sampler circuits 108.

The sampler circuit 108a generates, based on the analog voltage and Vin1, an output voltage. The sampler circuit 108b generates, based on the analog voltage and Vin2, the output voltage. The sampler circuit 108c generates, based on the analog voltage and VinX, the output voltage. By ensuring that the analog voltage matches or nearly matches the input voltage range to the samplers circuits, the logic circuit 130 is able to maximize the measurement accuracy of the sampler circuits 108.

Figure 2:
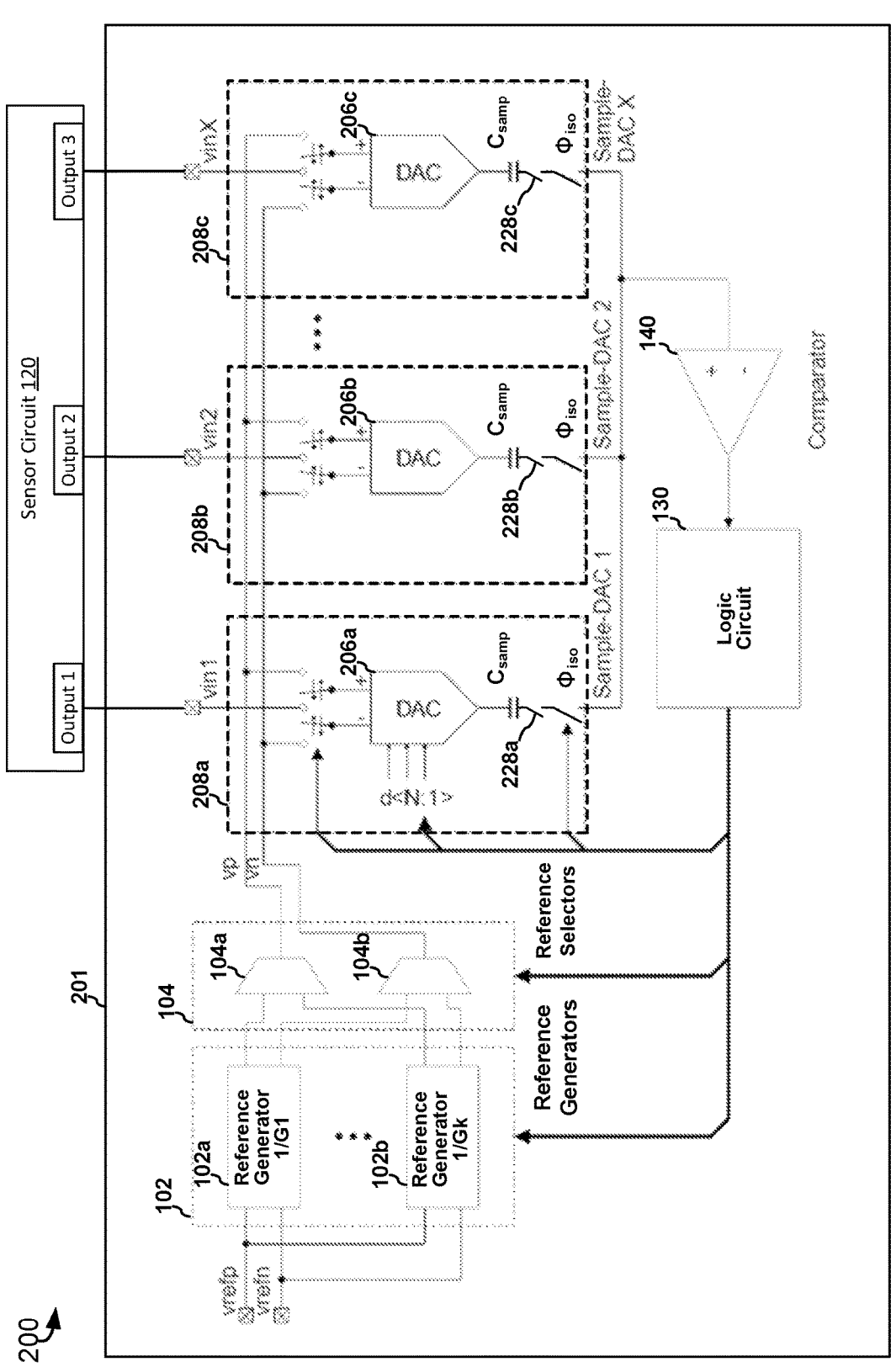
FIG. 2 illustrates a variation of the example environment in FIG. 1, according to some embodiments.

FIG. 2 illustrates a variation of the example environment in FIG. 1, according to some embodiments. The environment 200 includes a PSSG circuit 201 and the sensor circuit 120. Although the PSSG circuit 201 includes some of the same components (e.g., reference generators 102, reference selectors 104, logic circuit 130, and comparator 140) as PSSG circuit 101 in FIG. 1, there are a couple notable differences. First, PSSG circuit 101 includes single DAC 106 that drives its output into each of the sampler circuits 108, but the PSSG circuit 201 moves the DAC into each of the sampler circuits 208. Specifically, sample circuit 208a includes DAC 206a, sample circuit 208b includes DAC 206b, and sample circuit 208c includes DAC 206c.

According to an illustrative embodiment, in a first operation, the PSSG circuit 201 samples the input voltage by connecting all switches of the DACs 206 to their corresponding Vin and closing the common mode switches. In a second operation, the PSSG circuit 201 stops sampling of the input voltage by opening the common mode switches 228 (e.g., 228a, 228b, and 228c) and then holds the sampled voltage until the sampler can undergo conversion. That is, the PSSG circuit 201 closes the common mode switches 228 during sampling to define the voltage on one side of the sampling capacitor, while the DACs 206 define the voltage on the other side. Alternatively, in some embodiments, the PSSG circuit 201 first opens the pair of input switches 229 (e.g., 229a, 229b, 229c) on the input side of the sampler circuits 208 before opening the common mode switches 228.

In a third operation, as long as the isolation switch 227 (e.g., 227a, 227b, and 227c) of a sampler is open, the sampler is in a hold state. Thus, an example sequence includes: opening a common mode switch 228 of the sampler circuit 208, opening the pair of input switches 229 of the sampler circuit 208, closing the isolation switch 227 of the sampler circuit 208, and closing and restarting the sampler circuit 208 by opening the isolation switch 227 and closing the common mode switch 228 and the pair of input switches 229.

In a fourth operation, upon the conversion start, the PSSG circuit 201 circuit chooses the gain setting, and thus the reference voltage, with which to convert the sampled voltage via the reference selectors 104. In some embodiments, the reference selectors 104 can be a simple analog multiplexer. In some embodiments, the PSSG circuit 201 may also switch the value of the gain implemented by the reference generator 102—this, however, may be at the cost of latency until the reference generator 102 settles to the new reference voltage. In a fourth operation, the PSSG circuit 201 then performs the A/D conversion with the selected reference voltage.

Figure 3:
FIG. 3 illustrates a block diagram of the example reference generators and reference selectors in FIG. 1 and FIG. 2, according to some embodiments.

FIG. 3 illustrates a block diagram of the example reference generators and reference selectors in FIG. 1 and FIG. 2, according to some embodiments. The reference generators 102 include reference buffer 302 (e.g., reference buffer 302a, reference buffer 302b, reference buffer 302c) and switches 105 (e.g., switch 105a, switch 105b, switch 105c, and switch 105d). The reference generators 102 also include resistors 303. Specifically, the reference generators 102 include resistor 303a (8R), resistor 303b (2R), resistor 303c (R), and resistor 303d (R). Each of the resistors 303 may be fixed resistors or adjustable resistors.

The reference generators 102 are configured to receive an input voltage range (referred to a reference voltage) that is from a negative reference (vrefn) to a positive reference (vrefp). The reference voltages used in the ADC's operation (vn and vp) get created by a divider circuitry followed by a reference buffer as shown in FIG. 2. In an example implementation, when using the Gain=1 setting, the reference can also be passed-through unbuffered.

$$vp - vn = \begin{cases} vrefp - vrefn, & \text{for Gain} = 1 \\ \frac{1}{3}(vrefp - vrefn), & \text{for Gain} = 3 \\ \frac{1}{6}(vrefp - vrefn), & \text{for Gain} = 6 \\ \frac{1}{12}(vrefp - vrefn), & \text{for Gain} = 12 \end{cases}$$

$$vp - vn = \frac{1}{\text{Gain}}(vrefp - vrefn)$$

However, in other embodiments, the gain setting may be set to any value that produces the desired ADC measurement accuracy for the particular application. For example, the gain setting may be set to a value that is greater than 1 (e.g., 2, 3, 10, etc.), which would scale down the reference voltage. Alternatively, the gain setting may be set to a value that is less than 1 (e.g., 0.5), which would effectively amplify (scale up) the reference voltage instead of scaling it down.

Although it allows for minimum latency between gain-selection and conversion start, there is no strict requirement to have any reference generator fixed to just a single setting. Rather, in some embodiments, the gain-setting of any reference generator can be dynamic, if the application constraints allow for it, while preserving and even further enhancing the existing advantages, such as area and power consumption.

Figure 4:
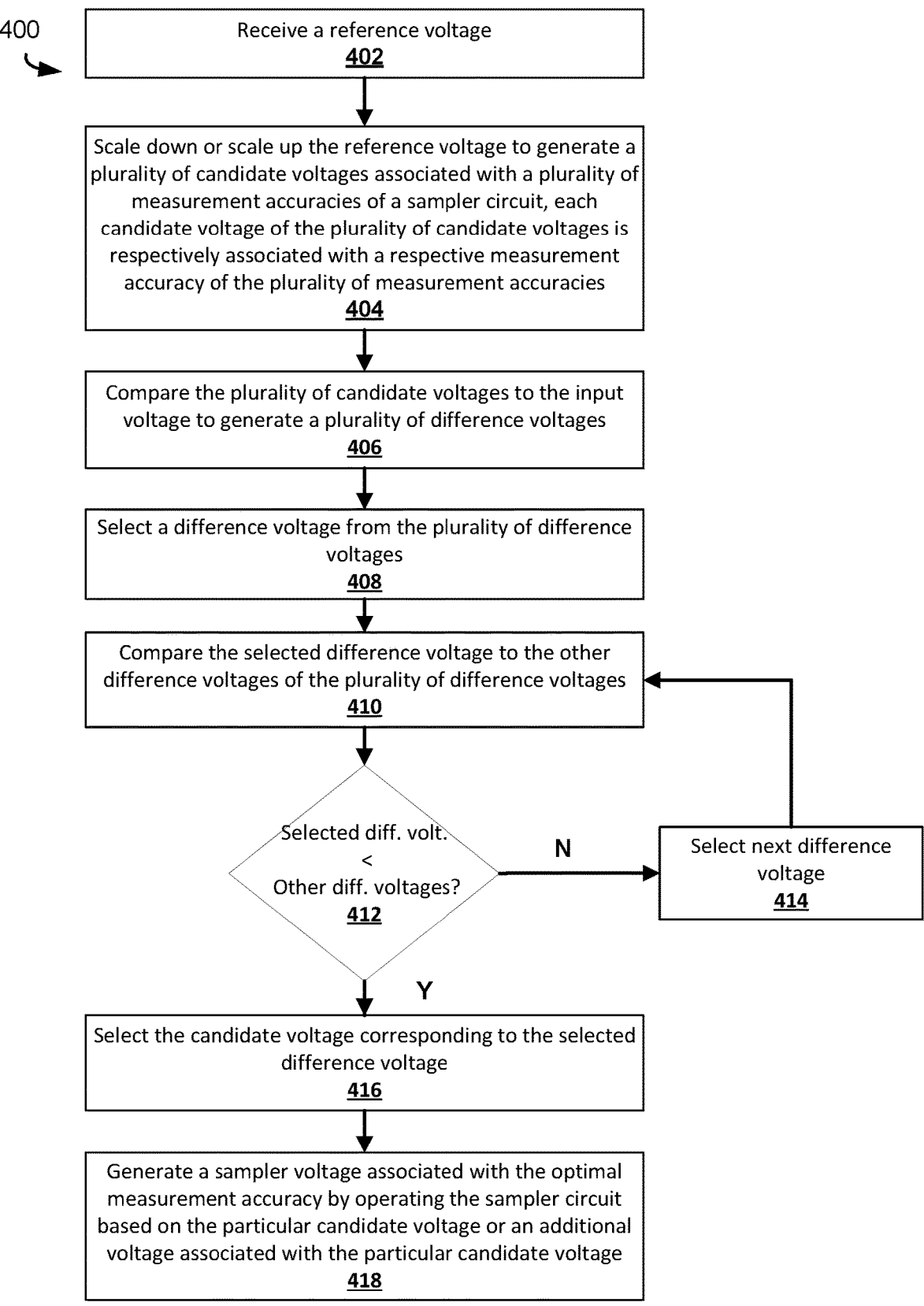
FIG. 4 is a flow diagram of a procedure for using a PSSG circuit to improve the measurement accuracy of S/H ADCs, according to some embodiments.

FIG. 4 is a flow diagram of a procedure for using a PSSG circuit to improve the measurement accuracy of S/H ADCs, according to some embodiments. Although the operations are depicted in FIG. 4 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the procedure 400 may be performed by processing logic that includes hardware (e.g., circuitry, dedicated logic, programmable logic, microcode, etc.), firmware, or a combination thereof. In some embodiments, some or all operations of procedure 400 may be performed by one or more components (e.g., reference generators 102, reference selectors 104, DAC 106, sampler circuits 108, logic circuit 130, comparator 140) of the PSSG circuit 101 in FIG. 1 and/or PSSG circuit 201 (e.g., reference generators 102, reference selectors 104, DAC 106, sampler circuits 208, logic circuit 130, comparator 140).

The procedure 400 will be described with respect to the PSSG circuit 101 in FIG. 1, but may be implemented using the PSSG 201 in FIG. 2 At operation 402, in some embodiments, the reference generators 102 receives a reference voltage. At operation 404, in some embodiments, the reference generators 102 scale down or scale up the reference voltage to generate a plurality of candidate voltages associated with a plurality of measurement accuracies of a sampler circuit. Each candidate voltage of the plurality of candidate voltages is respectively associated with a respective measurement accuracy of the plurality of measurement accuracies. The reference generators 102 may scale down or scale up the reference voltage to generate the plurality of candidate voltages by generating the plurality of candidate voltages based on a plurality of gain levels, where each candidate voltage is respectively associated with a respective gain level of the plurality of gain levels.

At operation 406, in some embodiments, the logic circuit 130 may compare the plurality of candidate voltages to the input voltage to generate a plurality of difference voltages. At operation 408, in some embodiments, the logic circuit 130 may select a difference voltage from the plurality of difference voltages. At operation 410, in some embodiments, the logic circuit 130 may compare the selected difference voltage to the other difference voltages of the plurality of difference voltages. At operation 412, in some embodiments, the logic circuit 130 may determine whether the selected difference voltage is less than other difference voltages of the plurality of difference voltages. If no, then the logic circuit 130 proceeds to operation 414 to select the next difference voltage from the plurality of difference voltages, and then to operation 410, to repeat the operation using the next difference voltage.

However, if the logic circuit 130 determines that the selected difference voltage is less than other difference voltages of the plurality of difference voltages, then the logic circuit 130 proceeds to operation 416 to select the candidate voltage corresponding to the selected difference voltage. At operation 418, in some embodiments, the logic circuit 130 generates a sampler voltage associated with the optimal measurement accuracy by operating the one or more sampler circuits 108 based on the particular candidate voltage or an additional voltage associated with the particular candidate voltage.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "scaling," "selecting," "generating," "determining," "comparing," "providing," "adjusting," "detecting," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment"

throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may include firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:

scaling down or scaling up a reference voltage to generate a plurality of candidate voltages associated with a plurality of measurement accuracies of a sampler circuit, each candidate voltage of the plurality of candidate voltages is respectively associated with a respective measurement accuracy of the plurality of measurement accuracies, wherein scaling down or scaling up the reference voltage comprises generating, based on a plurality of gain levels, the plurality of candidate voltages, each candidate voltage is respectively associated with a respective gain level of the plurality of gain levels;

selecting, by one or more processors and based on an input voltage for the sampler circuit, a particular candidate voltage from the plurality of candidate voltages that is associated with an optimal measurement accuracy of the plurality of measurement accuracies; and generating a sampler voltage associated with the optimal measurement accuracy by operating the sampler circuit based on the particular candidate voltage or an additional voltage associated with the particular candidate voltage.

2. The method of claim 1, further comprising:

determining the input voltage for the sampler circuit by reading a measurement value associated with the input voltage from a register location or a memory location.

3. The method of claim 1, further comprising:
determining the input voltage for the sampler circuit by sampling the input voltage.

4. The method of claim 1, wherein selecting, based on the input voltage for the sampler circuit, the particular candidate voltage from the plurality of candidate voltages comprises:
comparing the plurality of candidate voltages to the input voltage to generate a plurality of difference voltages;
determining that a particular difference voltage of the plurality of difference voltages is less than all other difference voltages of the plurality of difference voltages; and
determining that the particular difference voltage is associated with the particular candidate voltage.

5. The method of claim 1, wherein generating the sampler voltage by operating the sampler circuit based on the particular candidate voltage further comprising:
providing the particular candidate voltage to the sampler circuit; and
generating, using a first digital-to-analog converter (DAC) of the sampler circuit, a first DAC voltage; and
generating, using the sampler circuit, the sampler voltage based on the first DAC voltage.

6. The method of claim 5, further comprising:
providing the particular candidate voltage to a second sampler circuit; and
generating, using a second DAC of the second sampler circuit, a second DAC voltage; and
generating, using the second sampler circuit, the sampler voltage based on the second DAC voltage.

7. The method of claim 1, wherein generating the sampler voltage by operating the sampler circuit based on the additional voltage associated with the particular candidate voltage further comprising:
generating, using a single digital-to-analog converter (DAC), the additional voltage based on the particular candidate voltage; and
providing the additional voltage to the sampler circuit, adjusting, using the sampler circuit, the sampler voltage based on the additional voltage.

8. The method of claim 7, further comprising:
providing the additional voltage to a second sampler circuit,
adjusting, using the second sampler circuit, the sampler voltage based on the additional voltage.

9. The method of claim 1, further comprising:
detecting, after generating the sampler voltage, that the input voltage for the sampler circuit changed to an updated input voltage;
selecting, based on the updated input voltage, a different candidate voltage from the plurality of candidate voltages that is associated with a different measurement accuracy of the plurality of measurement accuracies; and
generating a different sampler voltage associated with the different measurement accuracy by operating the sampler circuit based on the different candidate voltage or a different voltage associated with the different candidate voltage.

10. An integrated circuit, comprising:
a plurality of reference generators;
a reference selector coupled to the plurality of reference generators;
one or more processors coupled to the reference selector; and
a sampler circuit coupled to the reference selector, wherein the plurality of reference generators is configured to:
scale down or scale up a reference voltage to generate a plurality of candidate voltages associated with a plurality of measurement accuracies of a sampler circuit, each candidate voltage of the plurality of candidate voltages is respectively associated with a respective measurement accuracy of the plurality of measurement accuracies;
wherein the one or more processors are configured to:
select, using the reference selector and based on an input voltage for the sampler circuit, a particular candidate voltage from the plurality of candidate voltages that is associated with an optimal measurement accuracy of the plurality of measurement accuracies; and
wherein the sampler circuit is configured to:
generate a sampler voltage associated with the optimal measurement accuracy by operating the sampler circuit based on the particular candidate voltage or an additional voltage associated with the particular candidate voltage.

11. The integrated circuit of claim 10, wherein to scale down or scale up the reference voltage to generate the plurality of candidate voltages, the plurality of reference generators is further configured to:
generate, based on a plurality of gain levels, the plurality of candidate voltages, each candidate voltage is respectively associated with a respective gain level of the plurality of gain levels.

12. The integrated circuit of claim 10, wherein one or more processors are further configured to:
determine the input voltage for the sampler circuit by reading a measurement value associated with the input voltage from a register location or a memory location.

13. The integrated circuit of claim 10, wherein one or more processors are further configured to:
determine the input voltage for the sampler circuit by sampling the input voltage.

14. The integrated circuit of claim 10, wherein to select the particular candidate voltage from the plurality of candidate voltages, the one or more processors are further configured to:
compare the plurality of candidate voltages to the input voltage to generate a plurality of difference voltages;
determine that a particular difference voltage of the plurality of difference voltages is less than all other difference voltages of the plurality of difference voltages; and
determine that the particular difference voltage is associated with the particular candidate voltage.

15. The integrated circuit of claim 10, wherein the sampler circuit further comprises a first digital-to-analog converter (DAC) configured to generate a first DAC voltage; and
wherein the sampler circuit is further configured to:
generate, using the sampler circuit, the sampler voltage based on the first DAC voltage.

16. The integrated circuit of claim 15, further comprising a second sampler circuit coupled to the reference selector, the second sampler circuit further comprises a second DAC configured to generate a second DAC voltage; and
wherein the second sampler circuit is further configured to:
generate, using the second sampler circuit, the sampler voltage based on the second DAC voltage.

17. The integrated circuit of claim 10, further comprising:

a single digital-to-analog converter (DAC) configured to generate the additional voltage based on the particular candidate voltage; and wherein the sampler circuit is further configured to:

adjust the sampler voltage based on the additional voltage.

18. The integrated circuit of claim 10, further comprising a second sampler circuit coupled to the reference selector, and wherein the one or more processors are further configured to:

detect, after generating the sampler voltage, that the input voltage for the sampler circuit changed to an updated input voltage;

select, using the reference selector and based on the updated input voltage, a different candidate voltage from the plurality of candidate voltages that is associated with a different measurement accuracy of the plurality of measurement accuracies; and wherein the second sampler circuit configured to:

generate a different sampler voltage associated with the different measurement accuracy by operating the sampler circuit based on the different candidate voltage or a different voltage associated with the different candidate voltage.

19. A method comprising:

receiving a plurality of candidate voltages associated with a plurality of measurement accuracies of a sampler circuit, each candidate voltage of the plurality of candidate voltages is respectively associated with a respective measurement accuracy of the plurality of measurement accuracies;

selecting a particular candidate voltage from the plurality of candidate voltages that is associated with an optimal measurement accuracy of the plurality of measurement accuracies; and forwarding the particular candidate voltage to permit a sampler circuit to generate, based on the particular candidate voltage, a sampler voltage associated with the optimal measurement accuracy.

\*    \*    \*    \*    \*